(12) United States Patent
Shinohara et al.

(10) Patent No.: US 7,189,002 B2
(45) Date of Patent: Mar. 13, 2007

(54) HYDROSTATIC GAS BEARING, HYDROSTATIC GAS BEARING DEVICE FOR USE IN VACUUM ENVIRONMENT, AND GAS RECOVERING METHOD FOR HYDROSTATIC GAS BEARING DEVICE

(75) Inventors: Shinji Shinohara, Fukuoka (JP); Takuma Tsuda, Fukuoka (JP); Takeshi Hayashida, Fukuoka (JP)

(73) Assignee: Toto Ltd., Fukuoka (JP)

( * ) Notice: Subject to any disclaimer, the term of this patent is extended or adjusted under 35 U.S.C. 154(b) by 0 days.

(21) Appl. No.: 11/298,712

(22) Filed: Dec. 12, 2005

(65) Prior Publication Data

US 2006/0093244 A1     May 4, 2006

Related U.S. Application Data

(63) Continuation of application No. 10/182,631, filed as application No. PCT/JP01/00582 on Jan. 29, 2001, now Pat. No. 7,052,182.

(30) Foreign Application Priority Data

| Feb. 1, 2000 | (JP) | ............................. 2000-024313 |
| Sep. 6, 2000 | (JP) | ............................. 2000-269703 |
| Dec. 22, 2000 | (JP) | ............................. 2000-390858 |

(51) Int. Cl.
*F16C 32/06* (2006.01)
(52) U.S. Cl. ...................................................... 384/12
(58) Field of Classification Search ................. 384/12, 384/42, 625, 902
See application file for complete search history.

(56) References Cited

U.S. PATENT DOCUMENTS

| 4,522,453 A | 6/1985 | Lammer et al. |
| 4,741,629 A | 5/1988 | Hooykaas |
| 4,749,283 A | 6/1988 | Yokomatsu et al. |
| 4,838,710 A | 6/1989 | Ohta et al. |
| 4,916,340 A | 4/1990 | Negishi |
| 5,098,872 A | 3/1992 | Suyama et al. |
| 5,133,561 A | 7/1992 | Hattori et al. |
| 5,562,395 A | 10/1996 | Yamazaki et al. |
| 5,784,925 A | 7/1998 | Trost et al. |
| 5,898,727 A | 4/1999 | Fujikawa et al. |
| 6,056,443 A | 5/2000 | Koike et al. |
| 6,126,169 A | 10/2000 | Sogard et al. |

FOREIGN PATENT DOCUMENTS

| JP | 2-21328 U | 2/1990 |
| JP | 2-212624 A | 8/1990 |

*Primary Examiner*—Thomas R. Hannon
(74) *Attorney, Agent, or Firm*—Carrier, Blackman & Associates, P.C.; Joseph P. Carrier; William D. Blackman

(57) ABSTRACT

In a hydrostatic gas bearing for use in a vacuum, in order to provide a hydrostatic gas bearing in which an increase in the quantity of gas being discharged during the movement of a moving body is reduced, the surface of a guide shaft of a fixed body and/or the surface of the moving body is subjected to processing for reducing adhesion of gas molecules, for example, by coating the surface(s) with a material having a low adhesion probability of gas molecules, by which the quantity of gas being discharged is decreased.

9 Claims, 6 Drawing Sheets

HYDROSTATIC GAS BEARING, HYDROSTATIC GAS BEARING DEVICE FOR USE IN VACUUM ENVIRONMENT, AND GAS RECOVERING METHOD FOR HYDROSTATIC GAS BEARING DEVICE

CROSS REFERENCE TO RELATED APPLICATION

This application is a Continuation of application Ser. No. 10/182,631, filed on Aug. 1, 2002, now U.S. Pat. No. 7,052,182 and claims priority under 35 U.S.C. § 371 of PCT International Application No. PCT/JP01/00582 which has an International filing date of Jan. 29, 2001, which designated the United States of America.

BACKGROUND OF THE INVENTION

1. Technical Field

The present invention relates to a hydrostatic gas bearing for use in a vacuum, a hydrostatic gas bearing device incorporating the hydrostatic gas bearing, and a gas recovering method for the hydrostatic gas bearing device.

2. Background Art

Conventionally, in a hydrostatic gas bearing for use in a vacuum, as a shape accuracy required for a moving body and a fixed body surface opposed to the moving body, only flatness to an extent of not affecting the size of a floating gap and a labyrinth seal gap has been required, and pores in the surface have especially not been considered. Also, in selecting the material of a guide shaft of the fixed body and the material of the moving body, only a property that the quantity of gas being discharged when the material is continuously exposed to a vacuum environment for a fixed period of time or more is small has been considered not to exert an influence on the reached degree of vacuum of mounted equipment.

Also, a general hydrostatic gas bearing is configured so that a high-pressure gas is released from an air pad provided on the moving body into a gap between the moving body and the fixed body surface, and the moving body and the fixed body are made in a non-contact state by the hydrostatic pressure of released gas, by which the moving body is moved with frictional resistance being scarcely encountered.

In the hydrostatic gas bearing as described above, in order to maintain the vacuum environment, it is desirable that an atmospheric pressure groove be provided around the air pad, and a mechanism for keeping the gas pressure in the atmospheric pressure groove at the atmospheric pressure provided.

The reason for this is that by providing the atmospheric pressure groove around the air pad, even in the design of hydrostatic gas bearing for vacuum, the load capacity, rigidity, and the like of the air pad can be designed by the same design technique as that for the ordinary hydrostatic gas bearing for use in an atmospheric environment.

Also, when the atmospheric pressure groove is not provided, all gas emitted from the air pad flows into an exhaust pump through a pressure reducing groove, so that the load of the exhaust pump increases undesirably. To prevent this phenomenon, the provision of the atmospheric pressure groove is also effective.

Therefore, as a mechanism for keeping the pressure in the atmospheric pressure groove at the atmospheric pressure, conventionally, an atmospheric pressure pipe has been connected to the atmospheric pressure groove provided around the air pad, and the other end of the atmospheric pressure pipe has simply been opened to the atmosphere on the outside of a vacuum chamber.

For the hydrostatic gas bearing manufactured by using the prior art, even when the quantity of gas discharged from a bearing device is lower than the specified discharge quantity in a stationary state, the quantity of gas discharged from the bearing device increases suddenly at the same time that the moving body starts to move, so that the reached pressure in the vacuum chamber is sometimes deteriorated remarkably. The reason for this is as described below. For example, in the hydrostatic gas bearing provided with the air pad on the moving body side, a portion covered by the moving body of the fixed body surface is exposed to a high-pressure floatation gas in a stationary state, and thus large quantities of gas molecules adhere to that portion. Subsequently, when the moving body moves and the surface thereof is exposed to the vacuum environment, large quantities of gas molecules adhering to the surface of guide shaft are discharged to the outside, which is resultantly detected as a sudden increase in the quantity of gas being discharged.

When the above-mentioned pressure increase occurs in a hydrostatic gas bearing mounted, for example, in an EB exposure system, a sudden increase in pressure degrades the accuracy of exposure pattern, and sometimes damages the electron beam source.

A hydrostatic gas bearing constructed so that the air pad is provided on the fixed body side also presents the same problem at the time of movement because gas molecules adhere to the surface of the moving body.

The inventor started research and development of a hydrostatic gas bearing capable of being used in an environment of higher vacuum (about $10^{-5}$ Pa). As the result, it was verified that there occurs, on rare occasions, a phenomenon that the gas pressure in the vacuum chamber increases due to the movement of the moving body even from a cause other than the gas supplied to the air pad.

Thus, in order to determine the cause and to provide a higher-performance hydrostatic gas bearing, the inventor further conducted research and development earnestly.

For example, in the case of a semiconductor exposure system, the vacuum chamber in which a hydrostatic gas bearing is mounted is usually placed in a clean room whose temperature and humidity are controlled.

In the hydrostatic gas bearing in which the atmospheric pressure groove in the bearing is simply opened to the atmosphere on the outside of vacuum chamber via the atmospheric pressure pipe, gas usually flows out from the bearing side to the atmosphere side. However, it was found that gas may sometimes flow in inversely from the atmosphere side to the bearing side depending on the pressure balance of the atmospheric pressure groove fluctuated by the bearing gap etc.

When gas flows inversely from the atmosphere side to the bearing side as described above, the atmosphere having a specific humidity flows in to the bearing side via the atmospheric pressure groove, and thus large amounts of water molecules undesirably adsorb on the surface of the guide shaft. If the moving body of the bearing starts to move in this state and the guide shaft surface on which water molecules have adsorbed is exposed to a vacuum, the adsorbing water molecules are released into the vacuum environment, which results in an increase in gas pressure in the vacuum chamber.

Even if the quantity of adsorbing water molecules is minute, when the pressure in the vacuum chamber is a high vacuum of about $10^{-5}$ Pa, a remarkable increase in pressure is observed. If such an increase in pressure occurs in the bearing, for example, in an electron beam exposure system, the above-mentioned phenomenon may cause a failure of light source and degradation of exposure accuracy.

In the hydrostatic gas bearing for use in an environment of an especially high vacuum, it is necessary to carry out control so that the causes for the increase in gas pressure in the vacuum chamber are obviated.

SUMMARY AND OBJECTS OF THE INVENTION

The present invention has been made to solve the above problems, and accordingly a first object thereof is to provide a hydrostatic gas bearing in which an increase in the quantity of gas being discharged during the movement of a moving body is reduced.

To achieve the above first object, the present invention provides a hydrostatic gas bearing for use in a vacuum, which is formed of a moving body and a fixed body opposed to the moving body, characterized in that the surface of a guide shaft of the fixed body and/or the surface of the moving body are subjected to processing for reducing adhesion of gas molecules. Since surface treatment for decreasing the quantity of adhering gas is done on the surface of the guide shaft of the fixed body and/or the surface of the moving body, the increase in the quantity of gas being discharged during the movement of the moving body is reduced.

The degree of vacuum in a vacuum chamber is required to be $10^{-3}$ to $10^4$ Pa or lower depending on the service conditions. Further, movement in a vacuum environment of about $10^{-5}$ Pa or lower is also expected in the future.

In this description, to decrease the quantity of adhering gas molecules means to decrease the quantity of adhering gas molecule so that gas molecules do not adhere to the guide shaft etc. to an extent that the pressure is not increased to an extent that even if adhering gas molecules are released in a vacuum, they do not hinder the use of device in the above-mentioned vacuum environment.

For example, conventionally, on the surface of the guide shaft newly exposed by the movement of moving body, gas molecules of about $10^{-6}$ mole per 1 m$^2$ adhere at the moment of exposure. These gas molecules are released in the vacuum, exerting an adverse influence on the use of hydrostatic gas bearing in a vacuum environment.

On the other hand, in the hydrostatic gas bearing in accordance with the present invention, the quantity of adhering gas molecules can be decreased to about $10^{-8}$ mole per 1 m$^2$, so that the use of hydrostatic gas bearing in a vacuum environment is not hindered.

In the present invention, the subjects to be subjected to the above-mentioned surface treatment are not limited to the surface of the fixed body. The effect of surface treatment can be achieved by subjecting a member exposed to the vacuum environment by the movement, of the bearing constituting members, to treatment immediately after the member is exposed to a high-pressure floatation gas.

Also, as the surface treatment for decreasing the quantity of adhering gas, the surface of the guide shaft of fixed body and/or the surface of the moving body is coated with a material having a lower adhesion probability of gas. By this method, the adhesion probability of gas on the bearing surface is decreased. Also, pores in a ceramics surface are filled with the coating and thus a smooth surface is formed, so that the quantity of adhering gas molecules is further decreased. For example, by coating an Al$_2$O$_3$ surface with TiC by CVD, the quantity of adhering H$_2$O, which especially poses a problem of adhesion of gas molecules, can be kept about two orders of magnitude smaller.

Also, since the film of TiC has electric conductivity, for the hydrostatic gas bearing mounted in an LB exposure system, an antistatic effect due to electron conduction can be expected.

As a preferred mode of the present invention, the guide shaft of the fixed body and/or the moving body formed of high-density ceramics having few pores in the surface thereof is manufactured, by which an increase in the quantity of gas being discharged caused by the influence of the above-mentioned pores is reduced.

Usually, since an infinite number of pores exist in the surface of ceramics, when the surface is exposed to a high-pressure gas, the pores are filled with the gas. Therefore, when the moving body moves and the surface thereof is exposed to a vacuum, the gas filled in the pores is slowly released into the vacuum chamber, so that the reached degree of vacuum of the vacuum chamber is deteriorated. Also, when the ceramics are machined, dirt such as a grinding fluid is liable to remain in the pores, and much gas adheres to the dirt, so that the dirt sometimes becomes a serious gas release source.

Ceramics having few pores can be obtained by a method in which ceramics are manufactured using fine-grain raw material powder having an average grain size of 1 μm or smaller, a method in which ceramics are subjected to hot press processing before firing to densify them, a method in which the ordinary alumina ceramics are subjected to HIP processing, or the like method. It is desirable that the theoretical density of pore area in the ceramics surface be 1% or lower.

Also, as a floatation gas for hydrostatic gas bearing suitable to the present invention, an inert gas such as argon, which has less interaction with a solid and less adhesion to the surface, is used to decrease the quantity of gas being discharged at the time of movement. When argon is used, since the gas molecular weight is higher than that of the ordinary gas (N$_2$ and O$_2$), the conductance of a labyrinth seal becomes low, which achieves an effect of obtaining high sealing performance.

Also, a second object of the present invention is to provide a hydrostatic gas bearing device for use in a vacuum environment, in which in the device, the pressure in an atmospheric pressure groove within the bearing when disposed in a vacuum environment is kept fixed, and the inflow of impurities such as water content of gas caused by the backward flow of outside gas into the atmospheric pressure groove through a pipe communicating with the atmospheric pressure groove is prevented, by which a decrease in the degree of vacuum in the vacuum environment can be prevented. The second object also involves provision of a gas recovering method for the hydrostatic gas bearing device.

To achieve the second object, the present invention provides a hydrostatic gas bearing device for use in a vacuum environment, in which a guide shaft and a moving body moving along the guide shaft are provided in a vacuum chamber; the moving body is formed with an air pad for releasing gas fed from the outside into a gap between the moving body and the guide shaft; an atmospheric pressure groove, which recovers the gas released into the gap and discharges the recovered gas to the outside through a pipe, is provided around the air pad; and a pressure reducing groove, which recovers the gas having not been recovered by the atmospheric pressure groove and discharges the recovered gas to the outside through a pipe, is provided around the atmospheric pressure groove, characterized in that in the pipe for discharging the gas recovered through the atmospheric pressure groove to the outside, there is provided a pressure buffering chamber, in which the internal gas pressure thereof is a fixed pressure higher than the atmospheric pressure so that gas does not flow backward from the outside to the atmospheric pressure groove through the pipe.

Thereby, the inflow of impurities such as water content of gas caused by the backward flow of outside gas into the atmospheric pressure groove within the bearing through the pipe is inhibited, by which a decrease in the degree of vacuum in the vacuum environment can be prevented.

In particular, in the hydrostatic gas bearing for use in a high vacuum environment, the present invention achieves great effects.

Also, it is preferable that the pressure buffering chamber be provided with a gas recovery port connected with a pipe for recovering gas from the atmospheric pressure groove; a gas feed port connected with a pipe for feeding gas by controlling the quantity of gas being fed so that the gas pressure in the pressure buffering chamber is a fixed pressure higher than the atmospheric pressure; and a gas leak port connected with a pipe for always discharging the gas in the pressure buffering chamber to the outside.

Thereby, since gas is always discharged to the outside through the gas leak port of the pressure buffering chamber, the inflow of impurities from the outside into the pressure buffering chamber can be prevented.

That is to say, impurities coming from the outside can be prevented from flowing into the atmospheric pressure groove, so that a decrease in the degree of vacuum of the vacuum environment can be prevented.

Also, as a gas fed into the pressure buffering chamber, high-purity nitrogen or dry air is preferable.

Thus, even if gas flows into the atmospheric pressure groove through the pressure buffering chamber, gas in the air containing much water does not flow in, and high-purity nitrogen flows into the pressure buffering chamber, so that there is no fear of degraded vacuum environment.

Also, in a gas recovering method for the hydrostatic gas bearing device, the gas pressure in a pressure buffering chamber provided on the outside of the hydrostatic gas bearing device is controlled so as to be a fixed pressure higher than the atmospheric pressure to always discharge gas from the pressure buffering chamber to the outside, and the gas recovered through the atmospheric pressure groove is also discharged to the outside through the pressure buffering chamber.

Thereby, since gas is always discharged to the outside through the gas leak port of the pressure buffering chamber, the inflow of impurities from the outside to the pressure buffering chamber can be prevented, and the gas released from the air pad can be recovered through the atmospheric pressure groove in the bearing.

That is to say, when the gas released from the air pad is recovered through the atmospheric pressure groove in the bearing, impurities coming from the outside can be prevented from flowing into the atmospheric pressure groove, so that a decrease in the degree of vacuum of the vacuum environment can be prevented.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

A preferred embodiment according to this embodiment will be described below.

Figure 1:
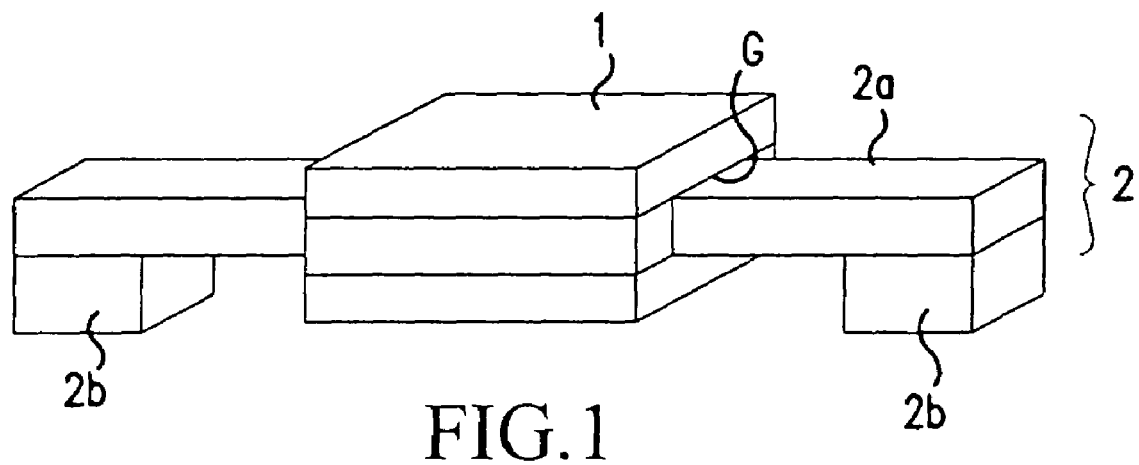
FIG. 1 is a perspective view showing one embodiment of a hydrostatic bearing mechanism in accordance with the present invention.

FIG. 1 is a perspective view showing one embodiment of a hydrostatic bearing mechanism for achieving the first object of the present invention. A moving body 1 is installed to a guide shaft 2a with a minute gap G provided therebetween so as to be capable of being moved transversely without friction by the supply of a floatation gas. At each end, right and left, of the guide shaft 2a is provided a support 2b which is fixed to a surface plate, not shown. The supports 2b are not necessarily be fixed to the surface plate, but each of the supports 2b of hydrostatic bearing in accordance with the present invention located horizontally may be fixed to a moving body of another hydrostatic bearing (not shown) arranged in parallel in the direction perpendicular to the guide shaft 2a. In this case, the moving body of hydrostatic bearing located horizontally can be moved two-dimensionally. When being fixed to another moving body, the guide shaft ends may be fixed directly to the moving body without the supports 2b.

Figure 2:
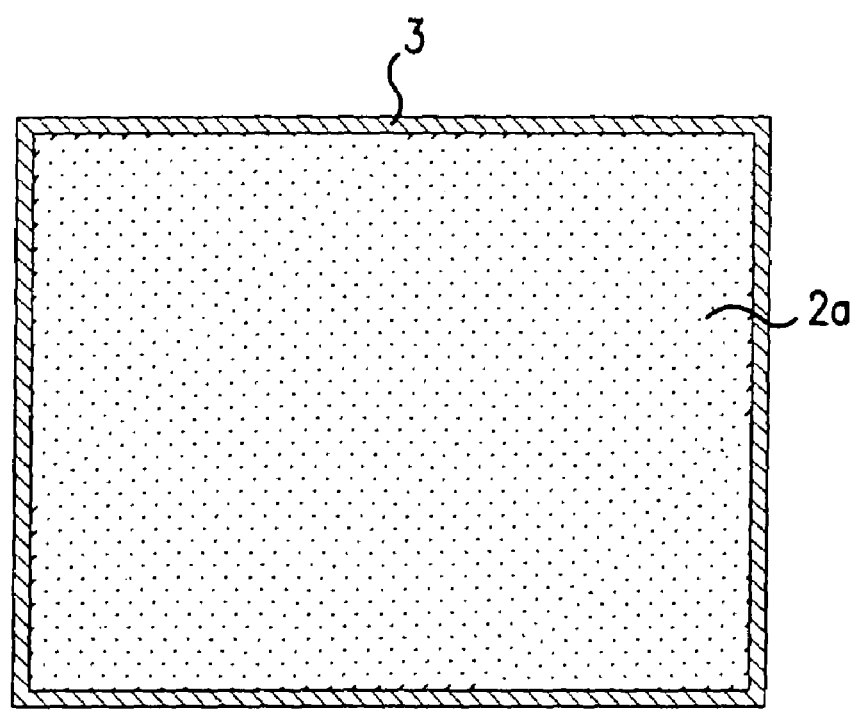
FIG. 2 is a sectional view showing one embodiment of a coating on a guide shaft according to the present invention.

FIG. 2 is a sectional view showing one embodiment of a hydrostatic bearing in accordance with the present invention, which view shows an example in which a coating 3 is applied to the surface of the guide shaft 2a. The coating 3 was applied to the outer periphery of the guide shaft 2a using a material having a low gas adhesion probability.

Hereunder, the improvement in performance achieved by the present invention will be described.

Figure 3:
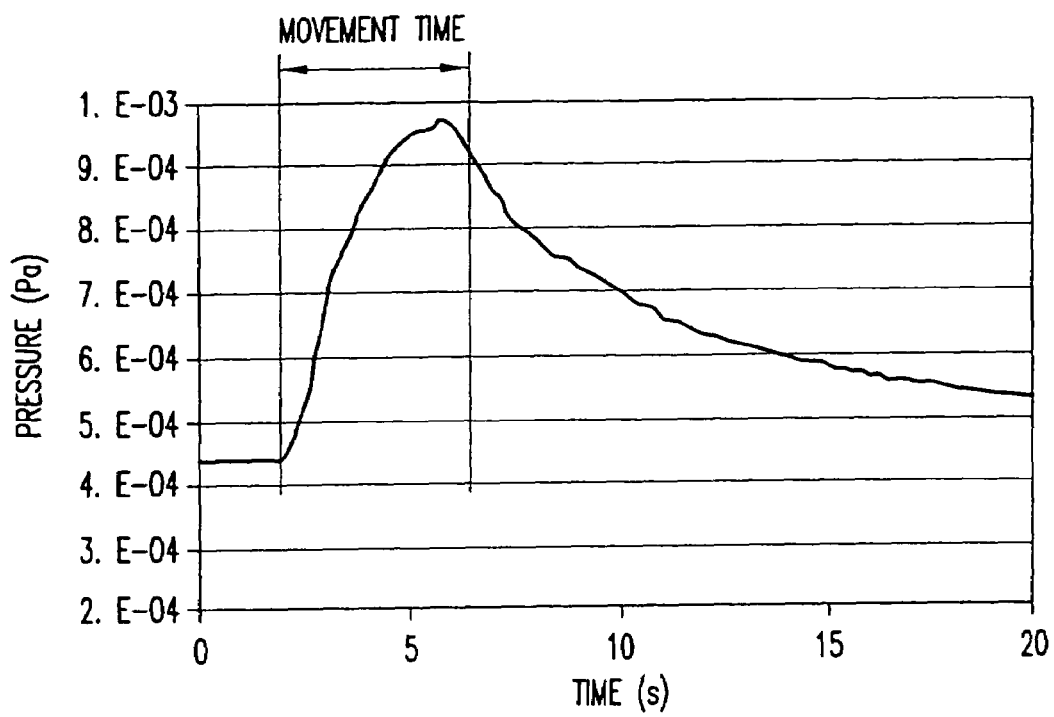
FIG. 3 is a graph showing a change in chamber pressure at the time when a conventional hydrostatic gas bearing for vacuum is moved in a vacuum chamber.

A conventional hydrostatic gas bearing was placed in a vacuum chamber of about $4 \times 10^{-4}$ Pa, and a change in the degree of vacuum in the vacuum chamber at the time when air is used as the floatation gas was shown in FIG. 3.

The ordinates represent the pressures in the vacuum chamber.

The abscissas represent times. First, recording was started in a state in which the bearing moving body stands still. After two seconds have elapsed, the movement of moving body was started (speed: 55 m/s), and then the moving body was stopped after the movement has been continued for about four seconds. The recording was finished 20 seconds after the measurement start (about 14 seconds after the stopping of moving body).

As shown in FIG. 3, when the conventional hydrostatic gas bearing was used, the chamber pressure began to increase simultaneously with the movement start and reached about $1 \times 10^{-3}$ Pa. The chamber pressure did not return to the original pressure even 20 seconds after the measurement start.

The reason for this is that gas molecules adhere to the guide shaft, and the guide shaft is exposed in the vacuum chamber by the movement of moving body, so that the adhering gas molecules are released into the vacuum.

When the movement speed is further increased, the pressure in the vacuum chamber increases in proportion to the speed.

Figure 4:
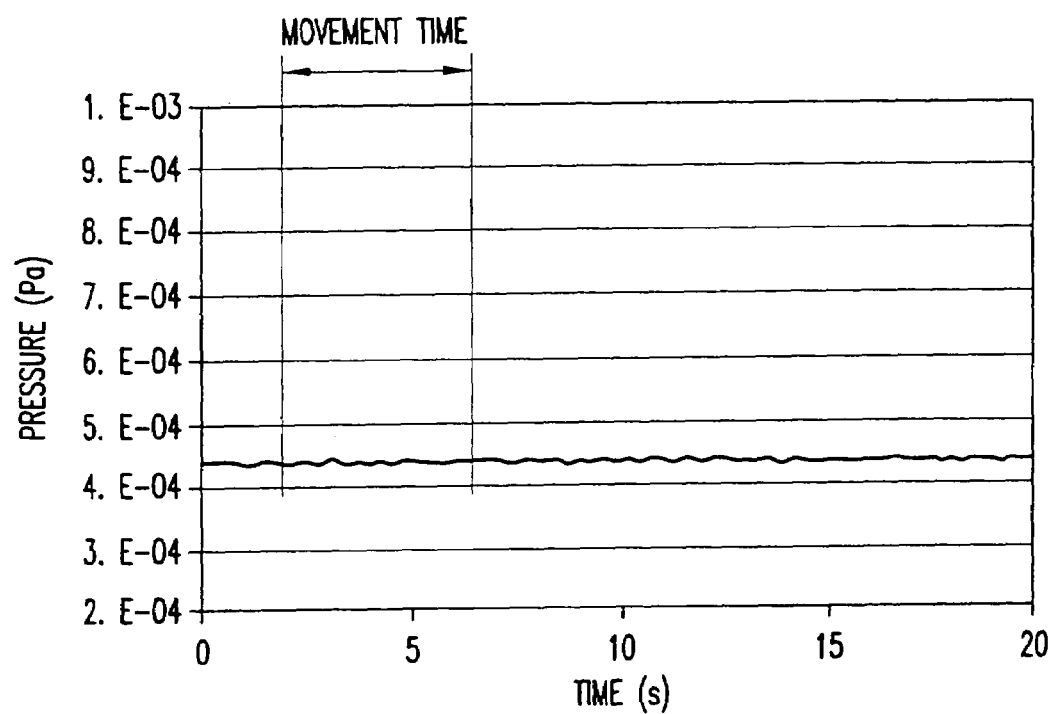
FIG. 4 is a graph showing a result of the same measurement as that of FIG. 3 using a hydrostatic gas bearing according to an aspect of the invention.

Next, a result of measurement made by using a hydrostatic gas bearing was shown in FIG. 4. The surface of fixed body was coated with TiC, and measurement was made under the same conditions as those of FIG. 3. As the result, the increase in chamber pressure caused by movement reduced to an extent of not being detected.

The coating material is not limited to TiC. SiC may be used, or a metal such as aluminum may be deposited.

Figure 5:
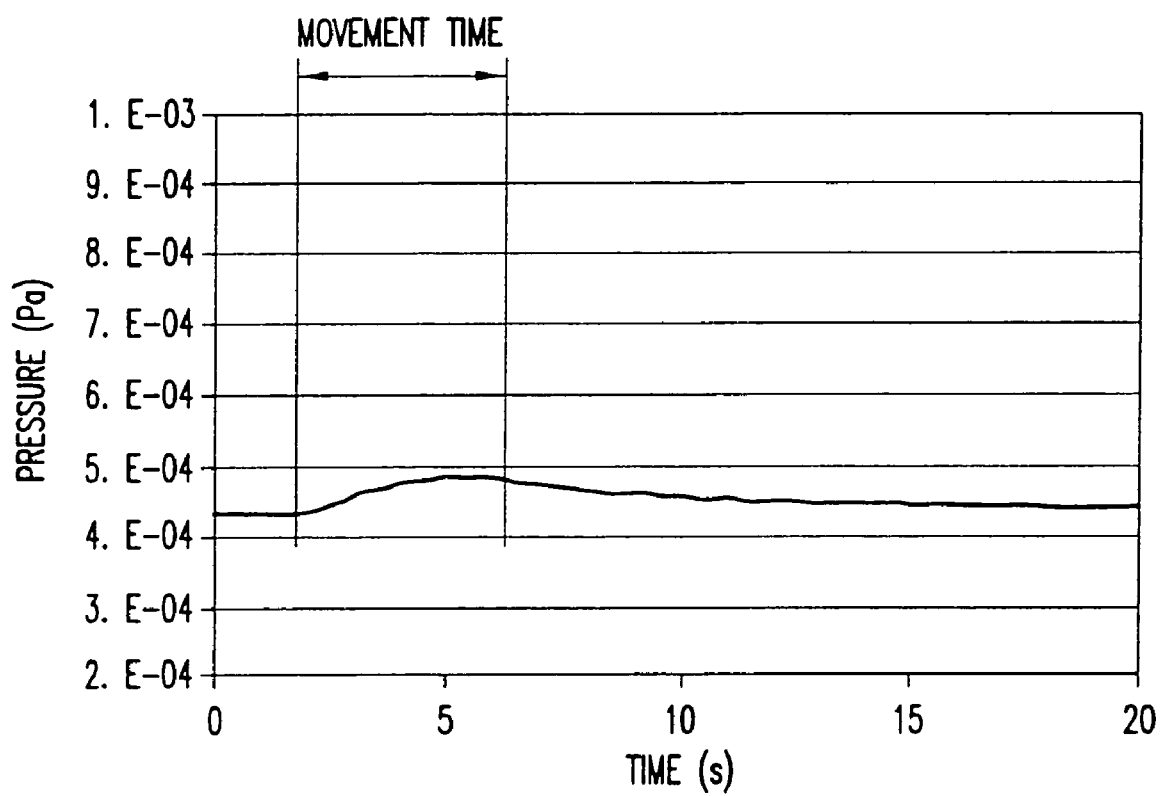
FIG. 5 is a graph showing a result of the same measurement as that of FIG. 3 using a hydrostatic gas bearing according to another aspect of the invention.

Contrarily, a result of measurement made by using a hydrostatic gas bearing was shown in FIG. 5. As a material for the fixed body, HIP processed alumina ceramics having a limited number of pores were used, and measurement was made under the same conditions as those of FIG. 3. As the result, the increase in chamber pressure reduced to about one-tenth of the conventional bearing (FIG. 3).

In this embodiment, since an air pad is provided on the moving body side, the surface treatment is done only on the surface of guide shaft 2a. However, in the hydrostatic gas bearing having a construction in which the air pad is provided on the fixed body side, surface treatment on the surface of moving body 1 is effective. Further, the surface treatment is not limited to either one of the guide shaft 2a and the moving body 1, and can be done on both of the guide shaft 2a and the moving body 1. As a concrete method for coating the ceramics surface with TiC, for example, a technique called plasma CVD, in which in a state in which ceramics are heated to 900° C., a mixture gas of $TiCl_4$ and $CH_4$ is made into a plasma state around the ceramics, by which TiC film is formed on the ceramics surface, can be used.

Also, as a concrete method for manufacturing ceramics having few pores by HIP, for example, a method in which fired alumina ceramics are held for 10 hours in argon gas having a high temperature of 1650° C. and a high pressure of 100 MPa is used.

Next, a hydrostatic gas bearing device A for achieving the second object of the present invention is shown in FIGS. 6 to 9.

Figure 6:
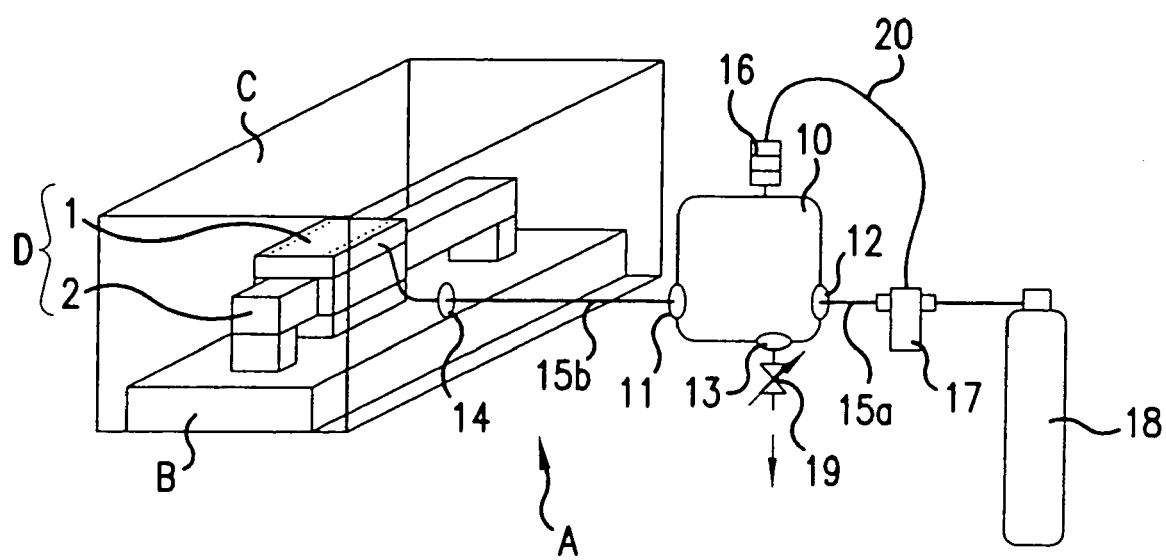
FIG. 6 is a perspective view of a hydrostatic gas bearing device in accordance with one embodiment of the present invention.

As can be seen in FIG. 6, the hydrostatic gas bearing device A has a surface plate B and a hydrostatic gas bearing D provided in a vacuum chamber C. The pressure of vacuum environment in the vacuum chamber C in which the hydrostatic gas bearing D moves is required to be $10^{-3}$ to $10^{-4}$ Pa or lower. Further, movement in a vacuum environment of about $10^{-5}$ Pa or lower is also expected in the future.

Figure 7:
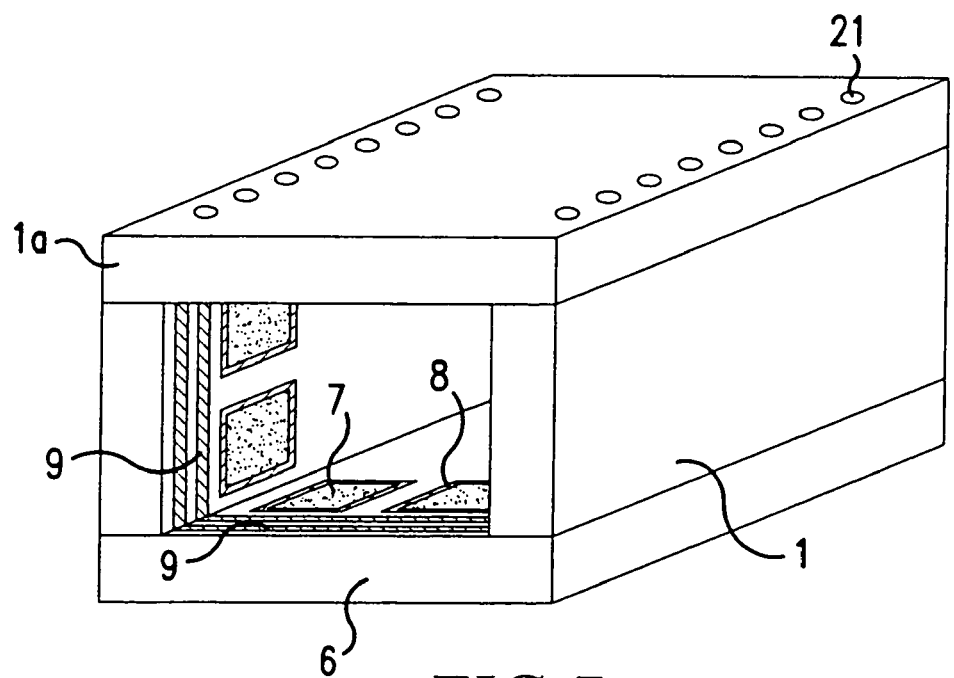
FIG. 7 is a perspective view of a moving body in accordance with one embodiment of the present invention.

The hydrostatic gas bearing D is formed of a moving body 1 and a guide shaft 2a (fixed body). As shown in FIGS. 7 to 9, the moving body 1 is formed with air pads 7 for releasing a gas supplied from the outside into a gap between the moving body 1 and the guide shaft 2. The moving body 1 includes upper plate 1a and lower plate 6. Further, around the air pad 7, there is provided an atmospheric pressure groove 8 for recovering the gas released into the gap and discharging it to the outside via a pipe 15b for atmospheric pressure groove.

Also, around the atmospheric pressure grooves 8, there is provided pressure reducing groove 9 for recovering the gas having not been recovered by the atmospheric pressure groove 8 and discharging it to the outside via a pipe.

Although the atmospheric pressure groove 8 and the pressure reducing groove 9 are provided in the moving body 1, the pipe for pressure reducing groove is also provided on the guide shaft 2a side.

Figure 8A:
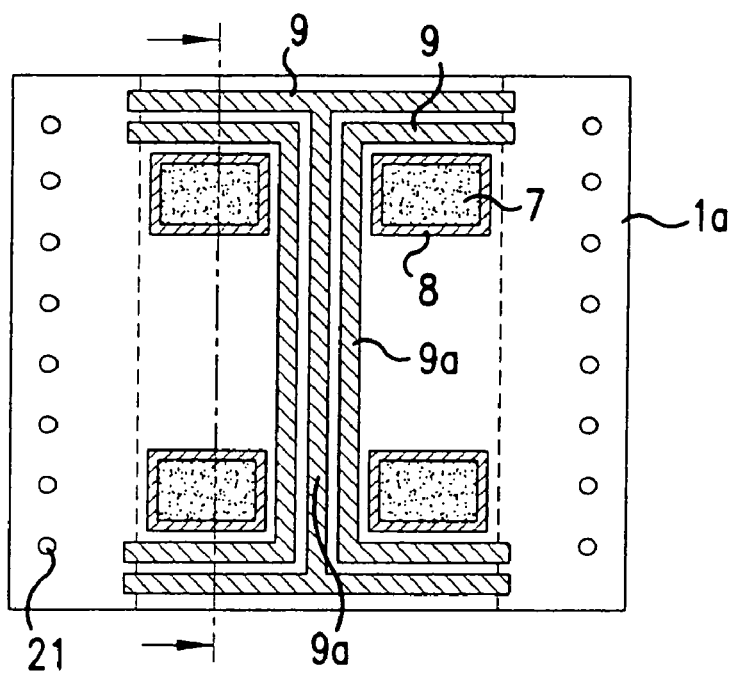
FIGS. 8(A) and (B) are plan views showing the inside of an upper plate member of the moving body shown in FIG. 7 and a sectional view thereof.
Figure 8B:
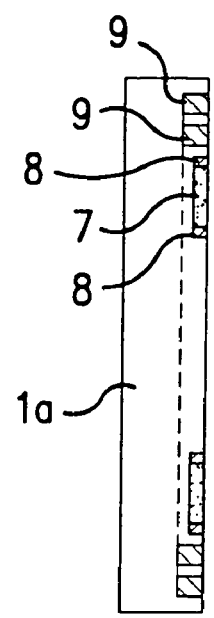

FIGS. 8(A) and (B), respectively, show an inside surface and a section view of an upper plate member 1a of the moving body 1. Bolt holes 21 indicate where an upper plate 1a is clamped to a side plate of the moving body 1. As shown in FIGS. 8(A) and (B), exhaust connecting groove 9a communicating with the pressure reducing groove 9 is formed in the vertical direction in the figure.

Figure 9A:
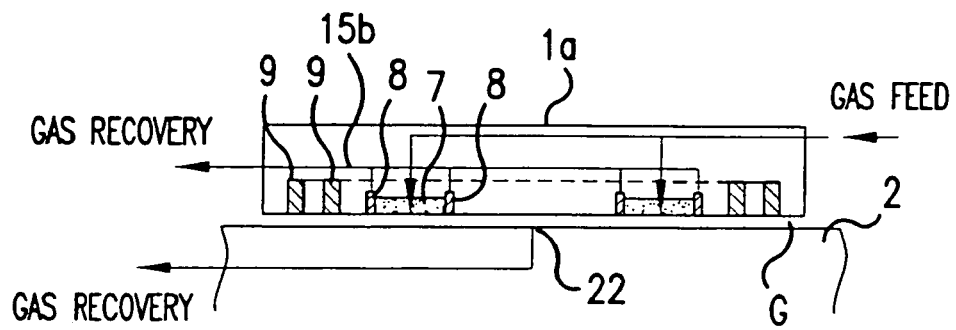
FIGS. 9(A)–(C) are sectional views showing the relationship between a lower plate of the moving body and a guide shaft.
Figure 9B:
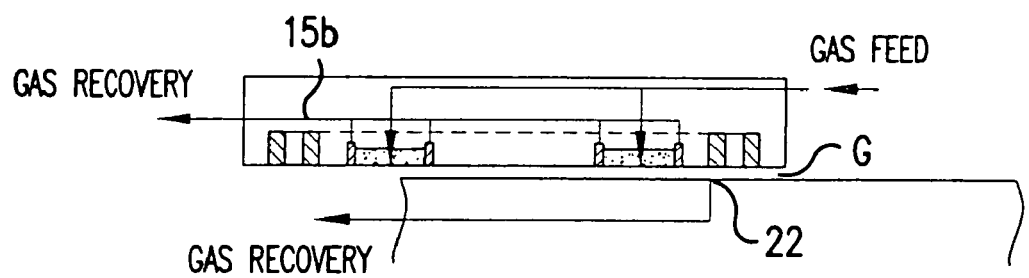
Figure 9C:
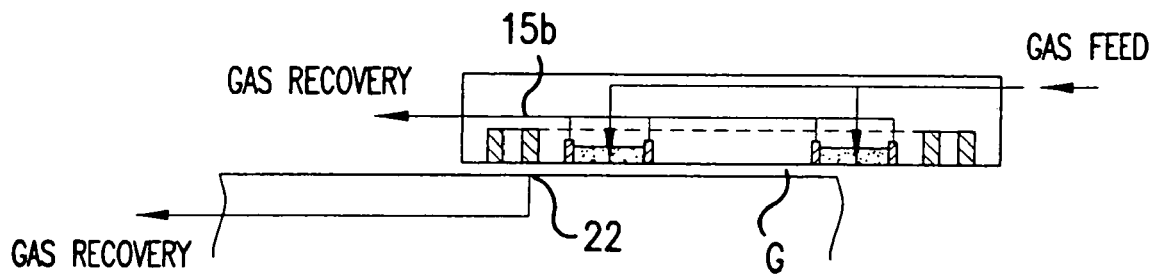

As can be seen in FIG. 9(A), the guide shaft 2a is formed with an exhaust hole for recovering gas through the pressure reducing groove 9 (including the exhaust connecting groove 9a) at a position opposed to the vertical exhaust connecting groove 9a (shown in FIG. 7). Therefore, even if the moving body 1 moves in the range from a position shown in FIG. 9(B) to a position shown in FIG. 9(C), the exhaust hole 22 communicates with the exhaust connecting groove 9a, so that gas in the pressure reducing groove 9 (including the exhaust connecting groove 9a) can be exhausted through the exhaust hole 22.

By the above-described configuration, by using the atmospheric pressure grooves 8 surrounding the air pads 7 of the hydrostatic gas bearing D, and further by using a labyrinth exhaust mechanism surrounding the atmospheric pressure grooves 8, the quantity of gas flowing out into the vacuum chamber C is kept small to an extent of having no influence on the degree of vacuum of the vacuum chamber C. A plurality of pressure reducing grooves 9 may be provided according to the required degree of vacuum of operation environment to improve the recovery rate of gas.

Also, although the case where the exhaust hole 22 for pressure reducing groove is provided within the guide shaft 2a has been shown, the pipe 15b can be provided in the moving body 1. For example, in order that the moving body 1 is made smaller in size and the pipe 15b is not restricted by the movement distance of the moving body 1, the pipe 15b is preferably provided in the moving body 1 if the pumping performance is sacrificed to some extent. In this case, the above-mentioned vertical pressure reducing groove 9 is unnecessary.

However, since gas is recovered by an evacuator, the diameter of the exhaust hole 22 for pressure reducing groove 9 is, in general, considerably larger than the diameter of the pipe 15b connected to the air pad 7 or the atmospheric pressure groove 8. In this case, if the exhaust hole 22 for pressure reducing groove 9 is connected to the moving body 1, the exhaust hole 22 works as a source of resistance and vibration, which may exert an adverse influence on the high movement accuracy required by the moving body 1. Therefore, the exhaust hole 22 for pressure reducing groove 9 should usually be provided on the guide shaft 2*a* side. (See FIGS. 9(A)–(C).)

In effect, it should be determined whether the exhaust hole 22 for pressure reducing groove 9 is provided in the moving body 1 or in the guide shaft 2*a* considering the size and movement distance of the moving body 1, the influence exerted on the moving body 1 as resistance by the exhaust hole 22 in the case where the exhaust hole 22 is connected to the moving body 1, and other factors.

In FIG. 6, a pipe and a feed pump for feeding gas to the air pad 7, the pipe for pressure reducing groove, and the evacuator are omitted.

As shown in FIG. 6, for this hydrostatic bearing device, a pressure buffering chamber 10 on the outside of the vacuum chamber C is connected to a pipe 15*b* for atmospheric pressure groove 8 for discharging the gas recovered through the atmospheric pressure groove 8 to the outside to prevent gas from flowing backward from the outside to the atmospheric pressure groove 8 through the pipe 15*b* for atmospheric pressure groove 8.

The pressure buffering chamber 10 is provided with a gas recovery port 11, a gas feed port 12, and a gas leak port 13.

The gas recovery port 11 is connected with the pipe 15*b* for atmospheric pressure groove 8 for recovering gas from the atmospheric pressure groove 8 through an introduction port 14 in the vacuum chamber C.

Also, the gas feed port 12 is connected with a gas feed pipe 15*a* for feeding gas by controlling the quantity of gas being fed so that the gas pressure in the pressure buffering chamber 10 is a fixed pressure higher than the atmospheric pressure. A pressure gage 16 is provided to measure the internal pressure of the pressure buffering chamber 10, and also a mass-flow controller 17 is connected in the gas feed pipe 15*a*. A signal is sent from the pressure gage 16 to the mass-flow controller 17 via a signal cable 20 so that the pressure in the pressure buffering chamber 10 is about 10% higher than the atmospheric pressure to control the flow rate of gas being fed. Thereby, the flow rate of nitrogen flowing from a nitrogen cylinder 18 into the pressure buffering chamber 10 through the gas feed pipe 15*a* is controlled.

Also, the gas leak port 13 is connected with a pipe for always discharging the gas in the pressure buffering chamber 10 to the outside. It is preferable that a leak valve 19 provided in the pressure buffering chamber 10 be throttled properly to regulate the flow rate of nitrogen flowing out from the leak valve 19 to the outside so as to be about 5 to 10 liters/minute. Thereby, the quantity of nitrogen being consumed can be kept small while the air is prevented from flowing from the leak valve 19 into the pressure buffering chamber 10.

The nitrogen supplied from the nitrogen cylinder 18 is preferably of high purity to prevent the degree of vacuum around the bearing from decreasing even if the gas in the pressure buffering chamber 10 flows backward to the atmospheric pressure groove 8. The purity of the high-purity nitrogen is preferably 99.99% or higher. Especially when the hydrostatic gas bearing is used in a high vacuum of about $10^{-5}$ Pa, the purity of nitrogen is preferably 99.9999% or higher.

Also, the gas fed into the pressure buffering chamber 10 through the gas feed pipe 15*a* may be dry air. In this case, the dry air preferably has a dew point of −30° C. or lower so that the degree of vacuum does not decrease even if the gas in the pressure buffering chamber 10 flows backward to the atmospheric pressure groove 8.

Next, a gas recovering method for a hydrostatic gas bearing 4 for use in the above-described vacuum environment will be described in due succession.

First, a high-pressure gas is released from the air pad 7 provided on the moving body 1 into the gap between the guide shaft 2*a* and the moving body 1. The moving body 1 and the guide shaft 2*a* are made in a non-contact state by the static force of the released gas, so that the moving body 1 can move along the guide shaft 2*a* with frictional resistance being scarcely encountered.

Next, the gas released into the above-mentioned gap is recovered through the atmospheric pressure groove 8 provided around the air pad 7.

At this time, the gas pressure in the pressure buffering chamber 10 provided on the outside of the hydrostatic gas bearing device A is controlled so as to be a fixed pressure higher than the atmospheric pressure (for example, a pressure 10% higher than the atmospheric pressure), by which gas is always discharged from the pressure buffering chamber 10 to the outside, and also the gas recovered through the atmospheric pressure groove 8 is also discharged to the outside through the pressure buffering chamber 10. Thereby, the outside air is prevented from flowing backward into the atmospheric pressure groove 8.

Further, in order to decrease the gas released in the vacuum from the end of the moving body 1, the gas that has not been recovered through the atmospheric pressure groove 8 is recovered through the pressure reducing groove 9 provided around the atmospheric pressure groove 8.

In the above-described process, the atmospheric pressure groove 8 communicates with the air only through the leak valve 19 provided in the pressure buffering chamber 10. Since nitrogen of about 5 to 10 liters/minute flows out through the leak valve 19, the inflow of impurities from the air can be restrained. Thereupon, the gas flowing into the atmospheric pressure groove 8 is only the gas flowing in through the air pad 7 or the nitrogen supplied from the nitrogen cylinder 18 through the pressure buffering chamber 10, so that a trouble such as an increase in the quantity of gas being discharged from the bearing caused by the inflow of impurities can be prevented.

INDUSTRIAL APPLICABILITY

As described above, in the present invention, since surface treatment is done on the surface of the guide shaft of the fixed body and/or the surface of the moving body to decrease the quantity of adhering gas, there can be provided a hydrostatic gas bearing capable of restraining the increase in the quantity of gas being discharged at the time of movement.

Also, the surface of the guide shaft of the fixed body and/or the surface of the moving body is coated with a material having a lower gas adhesion probability, especially, coating is performed on an $Al_2O_3$ surface by physically depositing TiC having electric conductivity. Therefore, there can be provided a hydrostatic gas bearing capable of keeping the quantity of adhering $H_2O$, which especially poses a problem of adhesion of gas molecules, about two orders of magnitude smaller than possible with conventional hydrostatic gas bearings.

Also, the guide shaft of the fixed body and/or the moving body is manufactured of high-density ceramics having few pores in the surface thereof. Therefore, there can be provided a hydrostatic gas bearing capable of reducing the increase in the quantity of gas being discharged caused by the influence of pores.

Also, as a floatation gas of the hydrostatic gas bearing, an inert gas such as argon, which has less interaction with a solid and less adhesion to the surface, is used. Therefore, there can be provided a hydrostatic gas bearing capable of decreasing the quantity of gas being discharged at the time of movement.

Further, according to the hydrostatic gas bearing device in accordance with the present invention, the pressure in the atmospheric pressure groove in the bearing in a vacuum environment is kept fixed, and the inflow of impurities such as water content of gas caused by the backward flow of outside gas into the atmospheric pressure groove through the pipe for atmospheric pressure groove is inhibited, by which a decrease in the degree of vacuum in the vacuum environment can be prevented.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A hydrostatic gas bearing for use in a vacuum, which is formed of a moving body and a fixed body in which the fixed body is provided with a guide shaft in a position opposed to said moving body,
    wherein the hydrostatic gas bearing has a structure in which the moving body and the guide shaft of the fixed body are supported in a non-contact state by supplying a flotation gas to a gap between the moving body and the guide shaft of the fixed body, and
    wherein a coating is applied to at least one of a surface of the moving body and a surface of the guide shaft so as to substantially maintain the pressure in a vacuum chamber when the hydrostatic gas bearing is being moved in a case where the hydrostatic gas bearing is used in the vacuum chamber.

2. The hydrostatic gas bearing according to claim 1, wherein said coating consists essentially of TiC.

3. The hydrostatic gas bearing according to claim 1, wherein said coating is applied to both of the surface of the moving body and the surface of the guide shaft.

4. The hydrostatic gas bearing according to claim 1, wherein said coating is applied to only one of the surface of the moving body and the surface of the guide shaft.

5. A hydrostatic gas bearing for use in a vacuum, which is formed of a moving body and a fixed body in which the fixed body is provided with a guide shaft in a position opposed to said moving body,
    wherein the hydrostatic gas bearing has a structure in which the moving body and the guide shaft of the fixed body are supported in a non-contact state by supplying a flotation gas to a gap between the moving body and the guide shaft of the fixed body, and
    wherein a coating is applied to a surface of the guide shaft of the fixed body so as to substantially maintain the pressure in a vacuum chamber when the hydrostatic gas bearing is being moved in a case where the hydrostatic gas bearing is used in the vacuum chamber.

6. The hydrostatic gas bearing according to claim 5, wherein TiC is used as the material of said coating.

7. The hydrostatic gas bearing according to claim 5, characterized in that as a floatation gas, an inert gas such as argon is used.

8. A hydrostatic gas bearing for use in a vacuum, which is formed of a moving body and a fixed body in which the fixed body is provided with a guide shaft in a position opposed to said moving body,
    wherein the hydrostatic gas bearing has a structure in which the moving body and the guide shaft of the fixed body are supported in a non-contact state by supplying a flotation gas to a gap between the moving body and the guide shaft of the fixed body, and
    wherein a coating is applied to a surface of the moving body so as to substantially maintain the pressure in a vacuum chamber when the hydrostatic gas bearing is being moved in a case where the hydrostatic gas bearing is used in the vacuum chamber.

9. The hydrostatic gas bearing according to claim 8, wherein TiC is used as the material of said coating.

* * * * *

UNITED STATES PATENT AND TRADEMARK OFFICE
CERTIFICATE OF CORRECTION

PATENT NO. : 7,189,002 B2
APPLICATION NO. : 11/298712
DATED : March 13, 2007
INVENTOR(S) : Shinohara et al.

It is certified that error appears in the above-identified patent and that said Letters Patent is hereby corrected as shown below:

Column 2:
    Line 7, change "same time that" to --same time as--.
    Line 18, change "surface of guide" to --surface of the guide--.
    Combine lines 44-52 into a single paragraph.
    Line 46, change "outside of vacuum" to --outside of the vacuum--.

Column 3:
    Line 30, change "$10^{-3}$ to $10^{4}$ Pa" to --$10^{-3}$ to $10^{-4}$ Pa--.
    Line 35, change "gas molecule so that gas molecules" to --gas molecules so that gas molecules--.
    Line 38, change "the use of device" to --the use of the device--.
    Line 41, change "movement of moving" to --movement of the moving--.
    Line 55, change "movement, of" to --movement of--.
    Line 59, change "of fixed body" to --of the fixed body--.

Column 4:
    Line 4, change "an LB exposure" to --an EB exposure--.

Column 6:
    Line 52, change "necessarily be fixed" to --necessarily fixed--.

Column 7:
    Line 11, change "movement of moving" to --movement of the moving--.
    Line 25, change "movement of moving" to --movement of the moving--.
    Line 31, change "surface of fixed" to --surface of the fixed--.

Column 8:
    Line 16, change "for atmospheric" to --for the atmospheric--.
    Line 24, change "pipe for pressure" to --pipe for the pressure--.
    Line 55, change "pressure reducing" to --the pressure reducing--.

Column 9:
    Line 17, change "pipe for pressure" to --pipe for the pressure--.
    Line 40, change "pressure gage" to --pressure gauge--.

UNITED STATES PATENT AND TRADEMARK OFFICE
CERTIFICATE OF CORRECTION

PATENT NO. : 7,189,002 B2
APPLICATION NO. : 11/298712
DATED : March 13, 2007
INVENTOR(S) : Shinohara et al.

It is certified that error appears in the above-identified patent and that said Letters Patent is hereby corrected as shown below:

Column 11:
Line 17, change "pipe for atmospheric" to --pipe for the atmospheric--.

Signed and Sealed this

Tenth Day of July, 2007

JON W. DUDAS
*Director of the United States Patent and Trademark Office*